(12) United States Patent
Sasaki

(10) Patent No.: US 9,815,277 B2
(45) Date of Patent: Nov. 14, 2017

(54) SUBSTRATE CONNECTION SYSTEM AND INKJET RECORDING DEVICE

(71) Applicant: RISO KAGAKU CORPORATION, Tokyo (JP)

(72) Inventor: Yasutaka Sasaki, Ibaraki (JP)

(73) Assignee: RISO KAGAKU CORPORATION, Tokyo (JP)

( * ) Notice: Subject to any disclaimer, the term of this patent is extended or adjusted under 35 U.S.C. 154(b) by 0 days.

(21) Appl. No.: 15/046,738

(22) Filed: Feb. 18, 2016

(65) Prior Publication Data

US 2016/0250849 A1  Sep. 1, 2016

(30) Foreign Application Priority Data

Feb. 27, 2015  (JP) .................................. 2015-037829

(51) Int. Cl.
| | | |
|---|---|---|
| *H03K 19/173* | (2006.01) | |
| *B41J 2/045* | (2006.01) | |
| *H03K 19/177* | (2006.01) | |
| *B41J 2/14* | (2006.01) | |

(52) U.S. Cl.
CPC ....... *B41J 2/04541* (2013.01); *B41J 2/04586* (2013.01); *H03K 19/17708* (2013.01); *B41J 2002/14491* (2013.01); *B41J 2202/20* (2013.01); *B41J 2202/21* (2013.01); *H03K 19/17728* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,999,306 A | * | 12/1976 | Koch, II | F26B 23/02 34/216 |
| 6,304,101 B1 | * | 10/2001 | Nishihara | G06F 17/5054 326/40 |
| 6,507,214 B1 | * | 1/2003 | Snyder | G06F 1/08 326/37 |
| 6,657,423 B2 | * | 12/2003 | Tanizawa | G01R 31/2829 324/522 |
| 6,765,407 B1 | * | 7/2004 | Snyder | G06F 1/08 326/37 |
| 7,218,137 B2 | * | 5/2007 | Vadi | H03K 19/17732 326/38 |
| 8,026,739 B2 | * | 9/2011 | Sullam | H03K 19/177 326/38 |
| 8,384,924 B2 | * | 2/2013 | Sato | H04N 1/00965 358/1.1 |
| 8,880,755 B2 | * | 11/2014 | Yoshida | G06F 11/3485 710/18 |
| 8,891,122 B2 | * | 11/2014 | Inokuchi | H04N 1/00007 358/1.15 |
| 8,994,445 B2 | * | 3/2015 | Sakai | H03L 5/00 327/518 |
| 2003/0105891 A1 | * | 6/2003 | Moriyama | G05B 19/0423 710/2 |
| 2004/0236873 A1 | * | 11/2004 | Kasame | G06F 15/7867 710/1 |

(Continued)

FOREIGN PATENT DOCUMENTS

| | | | |
|---|---|---|---|
| JP | 2007187448 A | * | 7/2007 |
| JP | 2010-55384 A | | 3/2010 |

*Primary Examiner* — Matthew Luu
*Assistant Examiner* — Lily Kemathe
(74) *Attorney, Agent, or Firm* — Greenblum & Bernstein, P.L.C.

(57) ABSTRACT

After powered on, a check unit rewrites a lookup table in a memory of a programmable logic circuit unit to one of lookup tables in its own memory so as to switch a circuit state that a logic circuit implements. When the check unit outputs an inquiry signal in this state and an identification signal which responds to the inquiry signal is input into the check unit from a check circuit of a sub substrate via the logic circuit and a port, the sub substrate corresponding to the identification signal is specified as a connection destination of connectors. The circuit state of the logic circuit is optimized on the basis of a result of specification of the sub substrate as the connection destination obtained by repeating the above-mentioned operation.

8 Claims, 9 Drawing Sheets

(56) References Cited

U.S. PATENT DOCUMENTS

| | | | | |
|---|---|---|---|---|
| 2005/0088201 | A1* | 4/2005 | Devlin | G06F 1/26 |
| | | | | 326/38 |
| 2007/0159181 | A1* | 7/2007 | Hsu | G01R 31/2818 |
| | | | | 324/600 |
| 2010/0199112 | A1* | 8/2010 | Yokota | G06F 1/266 |
| | | | | 713/300 |
| 2011/0055407 | A1* | 3/2011 | Lydon | G06F 13/385 |
| | | | | 709/228 |
| 2011/0081154 | A1* | 4/2011 | Ueda | G01R 31/041 |
| | | | | 399/13 |
| 2013/0246669 | A1* | 9/2013 | Yoshida | G06F 11/3485 |
| | | | | 710/18 |
| 2013/0265603 | A1* | 10/2013 | Inokuchi | H04N 1/00007 |
| | | | | 358/1.14 |
| 2014/0015514 | A1* | 1/2014 | Shibuya | G01R 15/09 |
| | | | | 324/76.11 |
| 2014/0091835 | A1* | 4/2014 | Nelson | H03M 11/24 |
| | | | | 326/38 |
| 2016/0098949 | A1* | 4/2016 | Mo | G02F 1/1309 |
| | | | | 324/755.01 |

* cited by examiner

SUBSTRATE CONNECTION SYSTEM AND INKJET RECORDING DEVICE

BACKGROUND

1. Technical Field

The present invention relates to a substrate connection system which connects between substrates via a harness and an inkjet recording device that connects between substrates via a harness.

2. Related Art

A configuration for connecting between substrates via a harness is widely used in the fields of electric equipment and electronic equipment. For example, an inkjet recording device which prints an image on a sheet by ejecting ink from a nozzle in an inkjet head uses a configuration for connecting a sub substrate on which a drive circuit of the inkjet head is mounted to a main substrate of a printer engine via a harness.

Then, a line head system inkjet recording device which prints an image in a state in which inkjet heads are fixed while the sheet is being transferred includes a plurality of inkjet heads which is arrayed in a line in accordance with a print width of the sheet. In addition, a multi-color system inkjet recording device which prints a color image by using inks of a plurality of colors includes a plurality of inkjet heads corresponding to the ink colors.

In the inkjet recording device which includes the plurality of inkjet heads as mentioned above, each sub substrate on which the drive circuit of each inkjet head is mounted is connected to a common main substrate via the harness. Then, a signal which contains individual contents according to an ink ejection pattern of each inkjet head that the drive circuit of each sub substrate drives is output from the main substrate to each sub substrate.

Accordingly, it is important to correctly connect the main substrate with each sub substrate in order to transmit a signal corresponding to the drive circuit of each sub substrate to the correct sub substrate on which the drive circuit concerned is mounted.

Incidentally, signals to be transmitted from the main substrate to each sub substrate are all control signals for driving the inkjet heads by the drive circuits and a communication speed and communication contents demanded in transmission of these control signals are basically the same among all of the sub substrates. Therefore, in many cases, the harnesses and connectors used for connecting the main substrate and each of the sub substrates are made common for reduction in component costs.

If the common harness and connector are used as mentioned above, the possibility that the main substrate and each sub substrate may be connected together in an erroneous pattern due to faulty connection and a signal to be transmitted for one drive circuit may be erroneously transmitted to the sub substrate on which another drive circuit is mounted will be increased.

Such faulty connection is detected by the use of a device which has been proposed so far and is configured to autonomously diagnose a state of connection between two objects (see Japanese Patent Application Laid-Open Publication No. 2010-55384 as Patent Document 1). In the device relevant to this proposal, a master-side board and a slave-side board are connected together by a cable with connector, an operation signal line of the master-side board which is communicated with the cable is grounded and an operation signal line of the slave-side board is pulled up.

Thereby, the connection state between the master-side board and the slave-side board is detected depending on whether a signal level appearing in the operation signal line of the slave-side board is a ground level or a signal level of a pull-up destination.

SUMMARY

The ability of the above-mentioned diagnosis device or the like is limited to detection of the faulty connection between the main substrate and each sub substrate. Accordingly, when the faulty connection is detected, it is necessary to perform connection work for correctly connecting again the main substrate with each sub substrate in order to eliminate the faulty connection. In addition, there is the possibility that the connection work which is performed for connecting again the main substrate with each sub substrate may induce again the faulty connection. Therefore, it is difficult to say procedurally and stochastically that the above-mentioned diagnosis device or the like eliminates the faulty connection between the main substrate and each sub substrate.

The present invention has been made in view of the above problem. One object of the present invention is to provide a substrate connection system which makes it possible to transmit and receive a correct signal between the main substrate and each sub substrate even when the main substrate and each of the plurality of sub substrates are connected together by using the same cable and connector. Another object of the present invention is to provide a preferable inkjet recording device by the use of the substrate connection system.

In order to attain the above-mentioned object, according to a first aspect of the present invention, there is provided a substrate connection system which includes a plurality of sub substrates;

a main substrate including a plurality of connectors to which a plurality of harnesses each connected to a controlled circuit mounted on each of the sub substrates is to be connected, respectively;

a main controller which is mounted on the main substrate and outputs a control signal for the controlled circuit on each of the sub substrates from each port corresponding to a sub substrate which is a transmission destination;

a programmable logic circuit unit which is mounted on the main substrate and capable of switching a pattern of connection between each port of the main controller and each of the plurality of connectors; and a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller.

According to a second aspect of the present invention, in the substrate connection system according to the first aspect of the present invention, there is also provided the substrate connection system which further includes a check circuit which is mounted in each of the sub substrates and outputs an identification signal for specifying the sub substrate which is the connection destination to the harness in response to an input of an inquiry signal that the sub controller outputs to the sub substrates which are the connection destinations respectively connected to the respective connectors via the harnesses every time the connection pattern of the programmable logic circuit unit is switched, wherein the sub controller specifies the sub substrates which are the connection destinations respectively connected to the respective connectors by the sub substrates which are the connection destinations specified by the identification signals from the respective sub substrate and the connectors into which the identification signals are input via the harnesses.

According to a third aspect of the present invention, in the substrate connection system according to the first and second aspects of the present invention, there is also provided the substrate connection system in which the programmable logic circuit unit is configured by a field-programmable gate array (FPGA) which includes a logic circuit and a memory that stores a lookup table for defining a circuit state realized by the logic circuit, and the sub controller switches the connection pattern of the programmable logic circuit unit by rewriting the content of the lookup table in the memory to a content corresponding to each of the connection patterns.

According to a fourth aspect of the present invention, in the substrate connection system according to the first to third aspects of the present invention, there is also provided the substrate connection system in which the sub controller fixes connection by the programmable logic circuit unit between the respective ports and the plurality of connectors to an open state when the sub controller fails to specify the sub substrates which are the connection destinations respectively connected to the respective connectors before the boot processing of the main controller.

In order to attain the above-mentioned object, according to a fifth aspect of the present invention, there is provided an inkjet recording device which forms an image on a print medium with ink ejected from nozzles of a plurality of inkjet heads, the inkjet recording device including:

a plurality of sub substrates on which drive circuits of the respective inkjet heads are mounted; and a main substrate having mounted thereon a plurality of connectors to which a plurality of harnesses connected to the respective drive circuits of the respective sub substrates is connected respectively, a main controller which outputs a control signal according to an ink ejection pattern of the respective inkjet heads that the respective drive circuits respectively drive from each port corresponding to a sub substrate which is a transmission destination, and a substrate connection system which switches a pattern of connection between respective ports of the main controller and the plurality of connectors, in which the substrate connection system includes a programmable logic circuit unit which is mounted on the main substrate and capable of switching a pattern of connection between each port of the main controller and each of the plurality of connectors; and a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller.

BRIEF DESCRIPTION OF DRAWINGS

The invention will now be described with reference to the accompanying drawings wherein.

DETAILED DESCRIPTION

In the following, embodiments of the present invention will be described below with reference to the drawings. Incidentally, the same or equivalent numerals or marks are assigned to the same or equivalent parts and constitutional elements throughout the drawings and description thereof is omitted or simplified.

Figure 1:
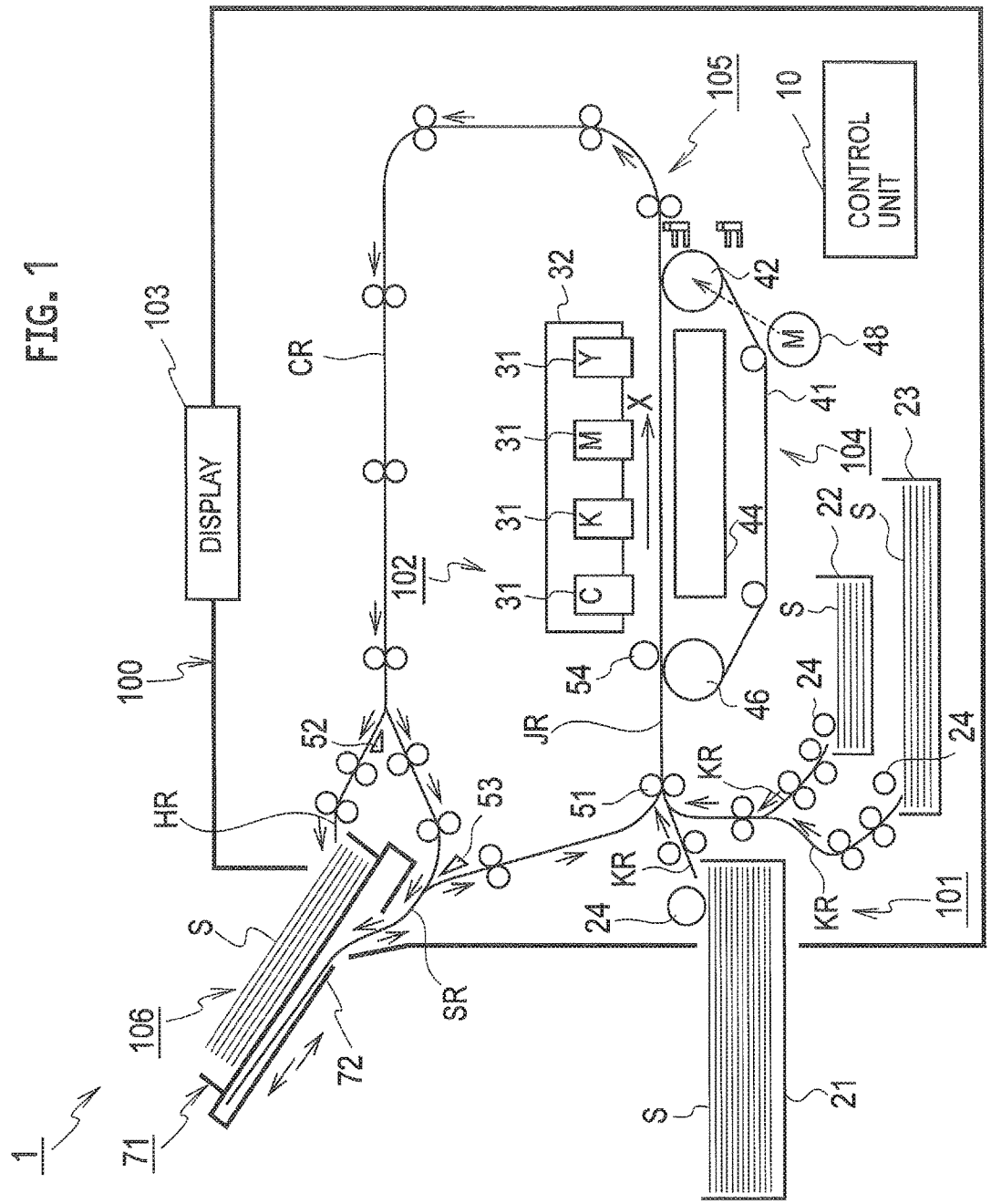
FIG. 1 is an explanatory diagram illustrating a schematic configuration of a multi-drop system line type inkjet printer to which a substrate connection system according to the present invention is applied.

First, a schematic configuration of a line type inkjet printer to which a substrate connection system according to the present invention is applied will be described with reference to an explanatory diagram in FIG. 1. In FIG. 1, the line type inkjet printer is illustrated (The line type inkjet printer will be abbreviated as an "inkjet printer 1" hereinafter. The inkjet printer 1 corresponds to an inkjet recording device in the appended claims).

The inkjet printer 1 includes a control unit 10, a paper feed unit 101, a printer unit 102, a display 103, a belt platen mechanism unit 104, a recording sheet circulation transfer path unit 105, and a paper discharge unit 106 which are installed inside and outside of a housing 100.

The paper feed unit 101 includes a side paper feed tray 21 which is arranged on a side surface of the housing 100, and a plurality of paper feed trays 22 and 23 which is arranged in a left lower region within the housing 100. Recording sheets S on the side paper feed tray 21 or the plurality of paper feed trays 22 and 23 are fed by each paper feed roller 24 sheet by sheet onto a paper transfer path KR. The fed recording sheet S is subjected to head position alignment by a registration roller pair 51 of the recording sheet circulation transfer path unit 105 and thereafter is transferred to the printer unit 102 on a circulation transfer path JR.

A plurality of line type inkjet heads is arranged above the printer unit 102. The line type inkjet head will be abbreviated as an "inkjet head 31" hereinafter. The inkjet head 31 corresponds to an inkjet head in the appended claims. The inkjet heads 31 are attached to a head holder 32.

Figure 2A:
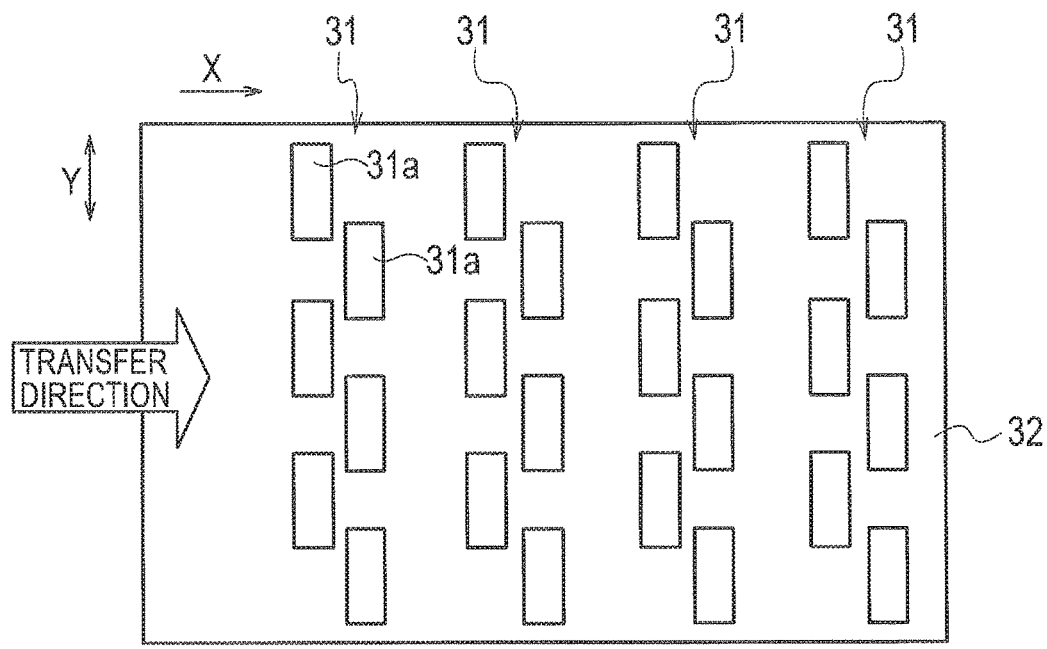
FIG. 2A is an explanatory diagram illustrating a schematic configuration of an inkjet head, illustrating the configuration from below a head holder.
Figure 2B:
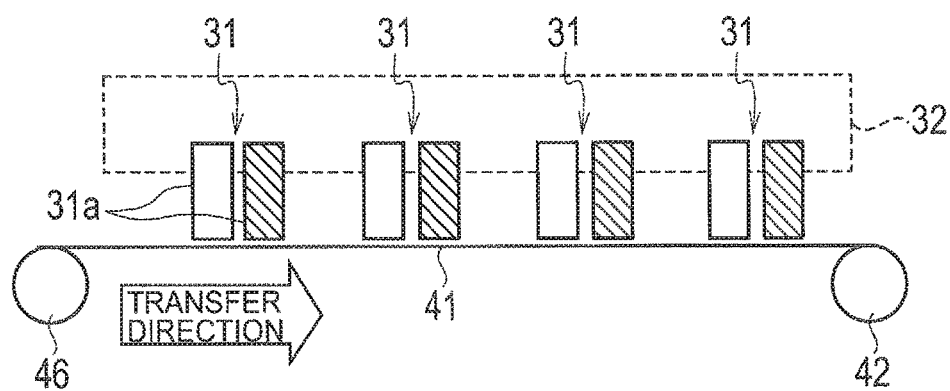
FIG. 2B is an explanatory diagram illustrating the schematic configuration of the inkjet head by enlarging a side section of the head holder.

FIGS. 2A and 2B illustrate a schematic configuration of the inkjet head, in which FIG. 2A is an explanatory diagram illustrating the inkjet head from below the head holder and FIG. 2B is an explanatory diagram illustrating the schematic configuration of the inkjet head by enlarging a side section of the head holder.

As illustrated in FIG. 2B, the inkjet heads 31 for respective colors are attached to the head holder 32 and are arranged at equal intervals in a transfer direction X (a sub-scanning direction) of the recording sheet S by the belt platen mechanism unit 104 from the upstream side toward the downstream side in order of the heads for C (cyan), K (black), M (magenta) and Y (yellow).

As illustrated in FIG. 2A, the inkjet head 31 for each color includes a plurality of head blocks 31a. The plurality of head blocks 31a for each color is arranged side by side in a main scanning direction Y which is orthogonal to the transfer direction X of the recording sheet S and is arranged by alternately displacing the positions in the transfer direction X. Thereby, the head blocks 31a are arranged such that an interval between nozzles (not illustrated) in most end parts of the adjacent two head blocks 31a matches an interval between the adjacent nozzles of the respective head blocks 31a.

Incidentally, in the present embodiment, description will be made for the case that the inkjet heads 31 for four colors are arranged corresponding to inks of the four colors (C, K, M and Y) by taking as an example the inkjet printer 1 compatible with full-color printing. However, for example, in a printer compatible with color printing other than full-color printing and a printer compatible with single color printing, the inkjet heads 31 of the number corresponding to the number of colors (one to three colors) of inks used may be arranged.

The head block 31a of each inkjet head 31 performs printing of a print image by a multi-drop inkjet system which makes it possible to change the number of drops of ink droplet ejected from the nozzle (not illustrated) up to five drops maximally for the same pixel. Multi-value data for printing which defines the number of drops of the ink droplet which is ejected from (the nozzle of) the inkjet head 31 for each color of each pixel is generated by a later described CPU 90 of the control unit 10 on the basis of print data for a print job which is input from a client terminal 14.

As illustrated in FIG. 1, the belt platen mechanism unit 104 is arranged under the plurality of inkjet heads 31 so as to face the printer unit 102.

In the belt platen mechanism unit 104, a belt-like belt platen 41 which loads and transfers a non-printed recording sheet S which is fed by the paper feed unit 101 or a recording sheet S with print on one side which is transferred along the later described circulation transfer path JR is bridged between a drive pulley 42 and a driven pulley 46 which are rotationally driven by a motor 48. The belt platen 41 includes many suction ports (not illustrated).

The recording sheet S on the belt platen 41 is pressed toward the belt platen 41 side by a paper press roller 54 and is sucked toward the belt platen 41 side by a negative pressure that a suction fan unit 44 which is arranged between the drive pulley 42 and the driven pulley 46 generates. The recording sheet S is transferred to the printer unit 102 in a state of being fixed onto the belt platen 41 due to suction by the negative pressure. A print image is printed in full color on the transferred recording sheet S by the plurality of inkjet heads 31 of the printer unit 102.

The printed recording sheet S is transferred along a normal transfer path CR of the recording sheet circulation transfer path unit 105, and, in simplex printing, is sorted by a first transfer path switch lever 52 so as to be transferred along a discharged sheet transfer path HR and is discharged onto a paper receiving tray 71 of the paper discharge unit 106.

In addition, in duplex printing, the recording sheet S is sorted by the first transfer path switch lever 52 so as to be transferred along a switchback transfer path SR and is reversed upside down by being subjected to a switchback operation along a recording sheet guide frame 72 on a back surface of the paper receiving tray 71. The reversed recording sheet S is sorted by a second transfer path switch lever 53, is again transferred to the registration roller pair 51, is subjected to head position alignment, and thereafter is again transferred to the printer unit 102 on the circulation transfer path JR.

Figure 3:
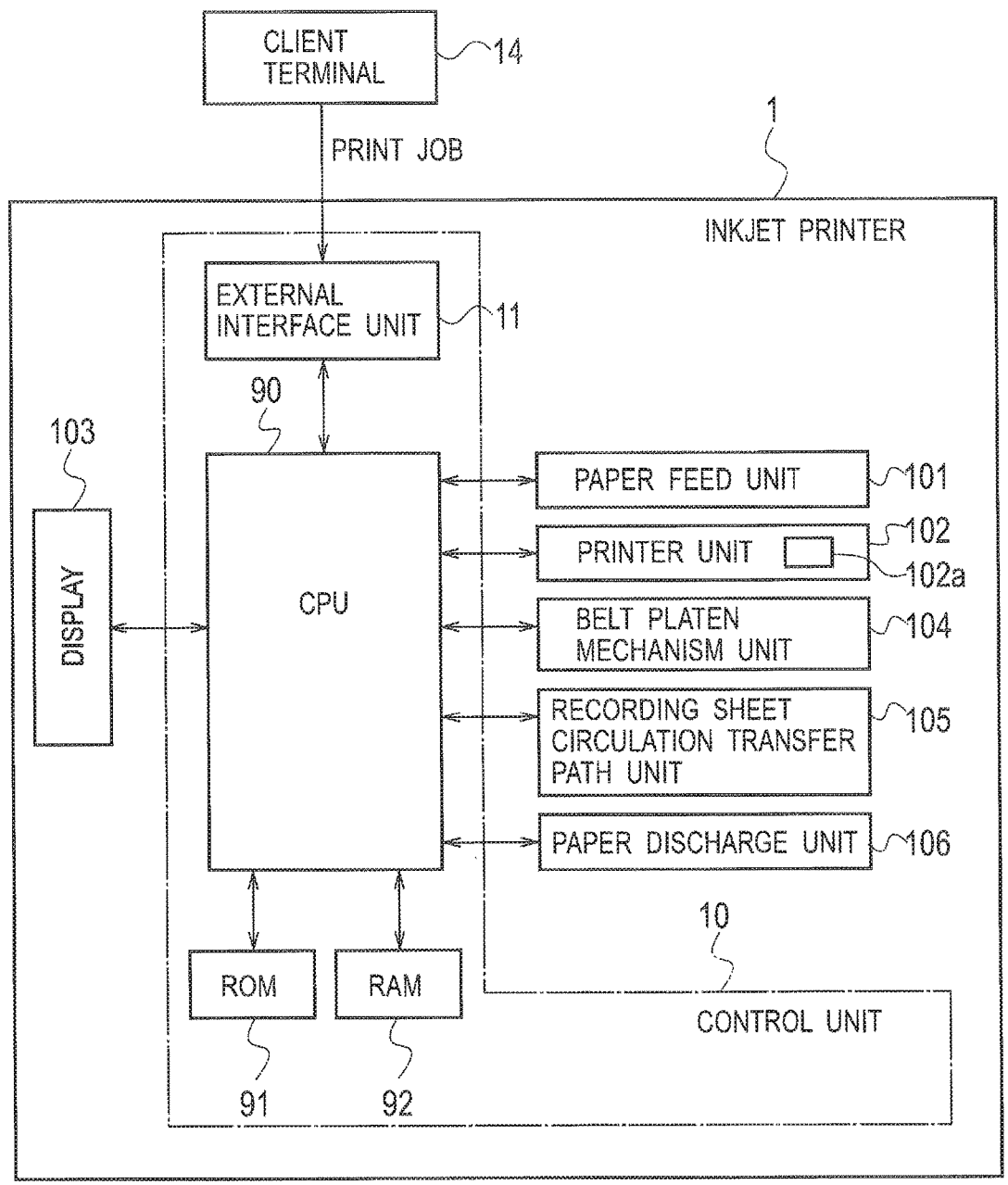
FIG. 3 is a block diagram illustrating a configuration of a control system of the inkjet printer in FIG. 1.

FIG. 3 is a block diagram illustrating an electric configuration of the control unit 10 in FIG. 1. The control unit 10 includes the CPU 90. The CPU 90 receives the print job from the client terminal 14 via an external interface unit 11. The print job includes postscript data and attribute data of the print image. The CPU 90 generates raster data of the print image from the postscript data in the received print job. The CPU 90 makes the printer unit 102 execute printing of the print image on the recording sheet S under a condition which is designated in the attribute data in the print job.

The multi-value data for printing for defining the number of drops of the ink droplet that the inkjet head 31 for each color of the printer unit 102 ejects corresponding to each pixel of the print image is generated by the CPU 90 on the basis of the postscript data in the print job which is input from the client terminal 14.

In addition, the display 103 is connected to the CPU 90 of the control unit 10. As illustrated in FIG. 1, the display 103 is arranged on an upper part of the inkjet printer 1. It is possible to utilize the display 103 as an input device and an information output device relevant to various operations of the inkjet printer 1.

The above-mentioned CPU 90 controls operations of respective units of the inkjet printer 1 on the basis of programs and setting information stored in a ROM 91 and in accordance with the contents which are input and set from the display 103.

Incidentally, the control unit 10 includes a RAM 92 and the RAM 92 includes a frame memory region. The raster data on the print image that the CPU 90 generates from the postscript data in the print job which has been input from the client terminal 14 into the control unit 10 is temporarily stored in the frame memory region for a while until the raster data on the print image is output to the printer unit 102.

The printer unit 102 includes a drive circuit 102a for driving the nozzle in the head block 31a of each inkjet head 31. The drive circuit 102a is arranged for every head block 31a of the inkjet head 31 for each color. A control signal according to an ejection pattern of ink ejected from the nozzles in each head block 31*a* is supplied from the CPU 90 of the control unit 10 to each drive circuit 102*a*.

The above-mentioned external interface unit 11, CPU 90, ROM 91, RAM 92 and so forth of the control unit 10 are mounted on one substrate. In addition, the drive circuits 102*a* of the inkjet heads 31 for the respective colors are individually mounted on substrates corresponding to the respective colors.

Then, it is possible to apply the substrate connection system according to the present invention to, for example, connection between a mounting substrate for the CPU 90 and so forth of the control unit 10 and a mounting substrate for each drive circuit 102*a*. Incidentally, in a case where the drive circuits 102*a* are provided for the respective head blocks 31*a* of the respective inkjet heads 31 and are respectively mounted on their individual substrates, it is possible to apply the substrate connection system according to the present invention to, for example, connection between the mounting substrate for the CPU 90 and so forth of the control unit 10 and the mounting substrate for the drive circuit 102*a* corresponding to each head block 31*a*.

Next, a case where the substrate connection system according to one embodiment of the present invention has been applied to the connection between the mounting substrate for the CPU 90 and so forth of the control unit 10 and the mounting substrate for each drive circuit 102*a* will be described with reference to FIGS. 4 to 9.

Figure 4:
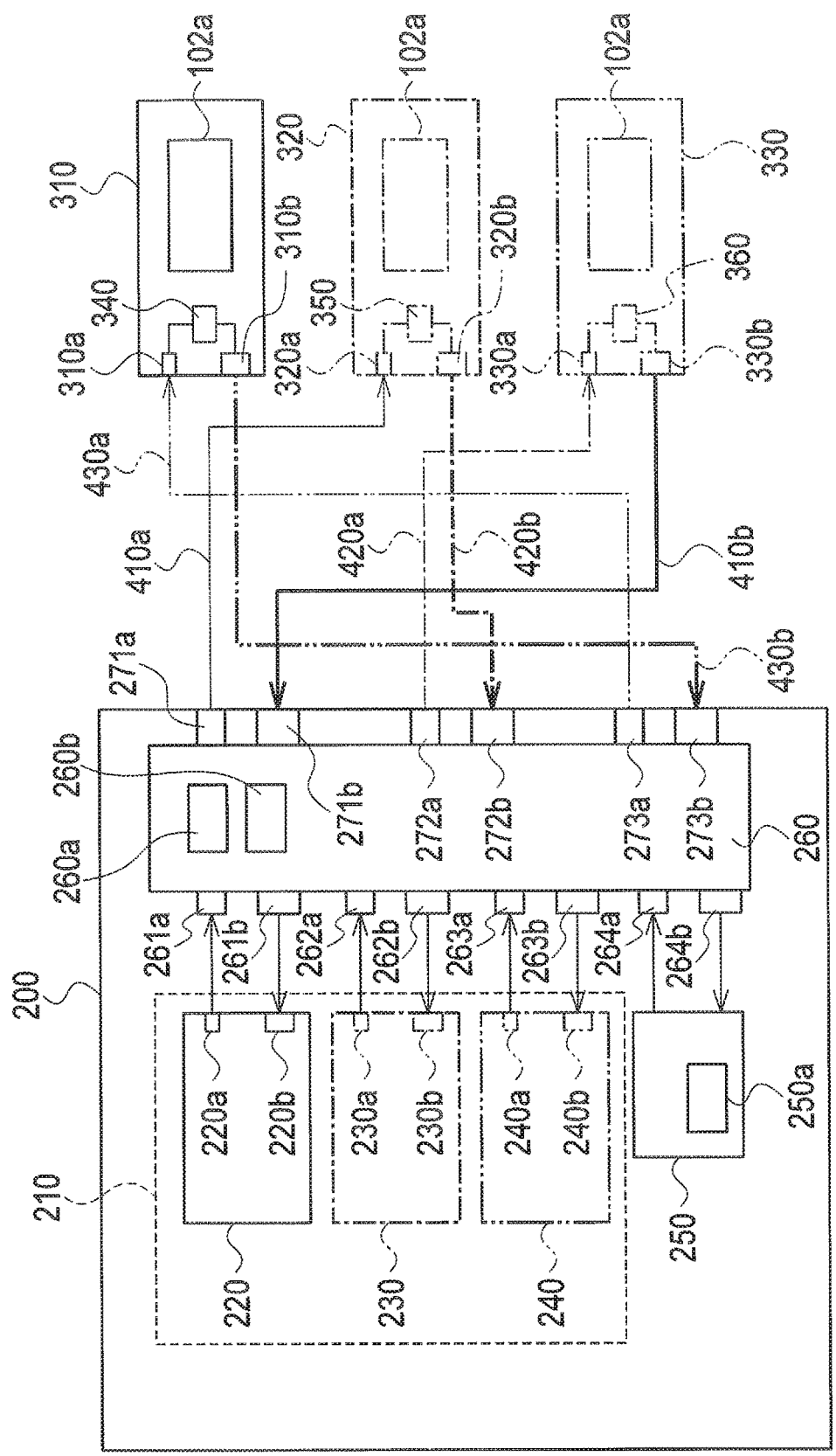
FIG. 4 is an explanatory diagram illustrating a schematic configuration of the substrate connection system according to one embodiment of the present invention to be applied to connection between a mounting substrate of a control unit and a mounting substrate of a drive circuit for a printer unit in FIG. 3.

FIG. 4 is an explanatory diagram illustrating a schematic configuration of the substrate connection system according to one embodiment of the present invention which has been applied to the connection between the mounting substrate for the CPU 90 and so forth of the control unit 10 and the mounting substrate for the drive circuit 102*a* of the printer unit 102.

A main substrate 200 illustrated in FIG. 4 is a substrate on which the CPU 90 (see FIG. 3) and so forth of the control unit 10 are to be mounted. The external interface unit 11, a microcomputer 210 which incorporates the CPU 90, the ROM 91, the RAM 92 and so forth, of the control unit 10, a check unit 250, a programmable logic circuit unit 260, and connectors 271*a* to 273*a* and 271*b* to 273*b* respectively used for connecting sub substrates 310 to 330 are mounted on the main substrate 200.

The CPU 90 of the microcomputer 210 implements control units 220 to 240 in the microcomputer 210 by executing a program stored in the ROM 91. The control units 220 to 240 (corresponding to the main controller in the appended claims) transmit and receive signals to and from the respective drive circuits 102*a* of the sub substrates 310 to 330 which are communication partners via respective ports 220*a* to 240*a* and 220*b* to 240*b* (corresponding to ports for the individual sub substrates as transmission destinations in the appended claims).

The signals for the respective drive circuits 102*a* of the sub substrates 310 to 330 are transmitted from the ports 220*a* to 240*a* of the control units 220 to 240 and the signals for the respective drive circuits 102*a* of the sub substrates 310 to 330 are received by the ports 220*b* to 240*b* of the control units 220 to 240.

Incidentally, control signals indicating an ejection pattern of inks ejected by the inkjet heads 31 or the nozzles (not illustrated) in the head blocks 31*a* that the respective drive circuits 102*a* drive are included in the signals that the control units 220 to 240 transmit to the respective drive circuits 102*a* of the sub substrates 310 to 330.

The check unit 250 (corresponding to a sub controller in the appended claims) is configured by a sequencer which is different from that of the microcomputer 210 and executes in order processes of a predetermined procedure to be described later.

The programmable logic circuit unit 260 is configured by a programmable logic circuit having a reconfiguration function which makes it possible to reconfigure (change) an internal circuit state. Specifically, in the present embodiment, the programmable logic circuit unit 260 is configured by a field-programmable gate array (FPGA) which includes a logic circuit 260*a*, a memory 260*b* for storing a lookup table which defines the circuit state to be implemented by the logic circuit 260*a*. That is, the reconfiguration function is implemented by the FPGA.

The programmable logic circuit unit 260 includes ports 261*a* to 263*a* and 261*b* to 263*b* to which the ports 220*a* to 240*a* and 220*b* to 240*b* of the respective control units 220 to 240 are to be connected and ports 264*a* and 264*b* to which the check unit 250 is to be connected.

The logic circuit 260*a* of the programmable logic circuit unit 260 implements a circuit for connecting the ports 261*a* to 263*a*, 261*b* to 263*b*, 264*a* and 264*b* with the connectors 271*a* to 273*a* and 271*b* to 273*b*. It is possible to switch the circuit state that the logic circuit 260*a* implements by rewriting the lookup table in the memory 260*b*.

That is, when the lookup table in the memory 260*b* is rewritten, the pattern of connection between the ports 261*a* to 263*a*, 261*b* to 263*b*, 264*a* and 264*b* and the connectors 271*a* to 273*a* and 271*b* to 273*b* is switched.

Incidentally, the plurality of lookup tables is stored in a memory 250*a* of the check unit 250 respectively corresponding to the plurality of circuit states implemented by the logic circuit 260*a*. That is, one lookup table corresponds to one circuit state of the logic circuit 260*a*.

In addition, the sub substrates 310 to 330 illustrated in FIG. 4 are substrates on which the drive circuits 102*a* (corresponding to controlled circuits in the appended claims) are to be mounted, respectively. Check circuits 340 to 360 used for checking connection to the main substrate 200 and connectors 310*a* to 330*a* and 310*b* to 330*b* used for connection to the main substrate 200 are respectively mounted on the respective sub substrates 310 to 330 in addition to the drive circuits 102*a*.

When an inquiry signal is input from the connectors 310*a* to 330*a*, the check circuits 340 to 360 output identification signals for the sub substrates 310 to 330 on which the check circuits 340 to 360 are mounted to the connectors 310*b* to 330*b* in response to inputting of the inquiry signal.

The connectors 271*a* to 273*a* and 271*b* to 273*b* of the main substrate 200 and the connectors 310*a* to 330*a* and 310*b* to 330*b* of the respective sub substrates 310 to 330 on which the elements which have been configured as mentioned above are respectively mounted are mutually connected by using harnesses 410*a* to 430*a* and 410*b* to 430*b*.

Figure 5:
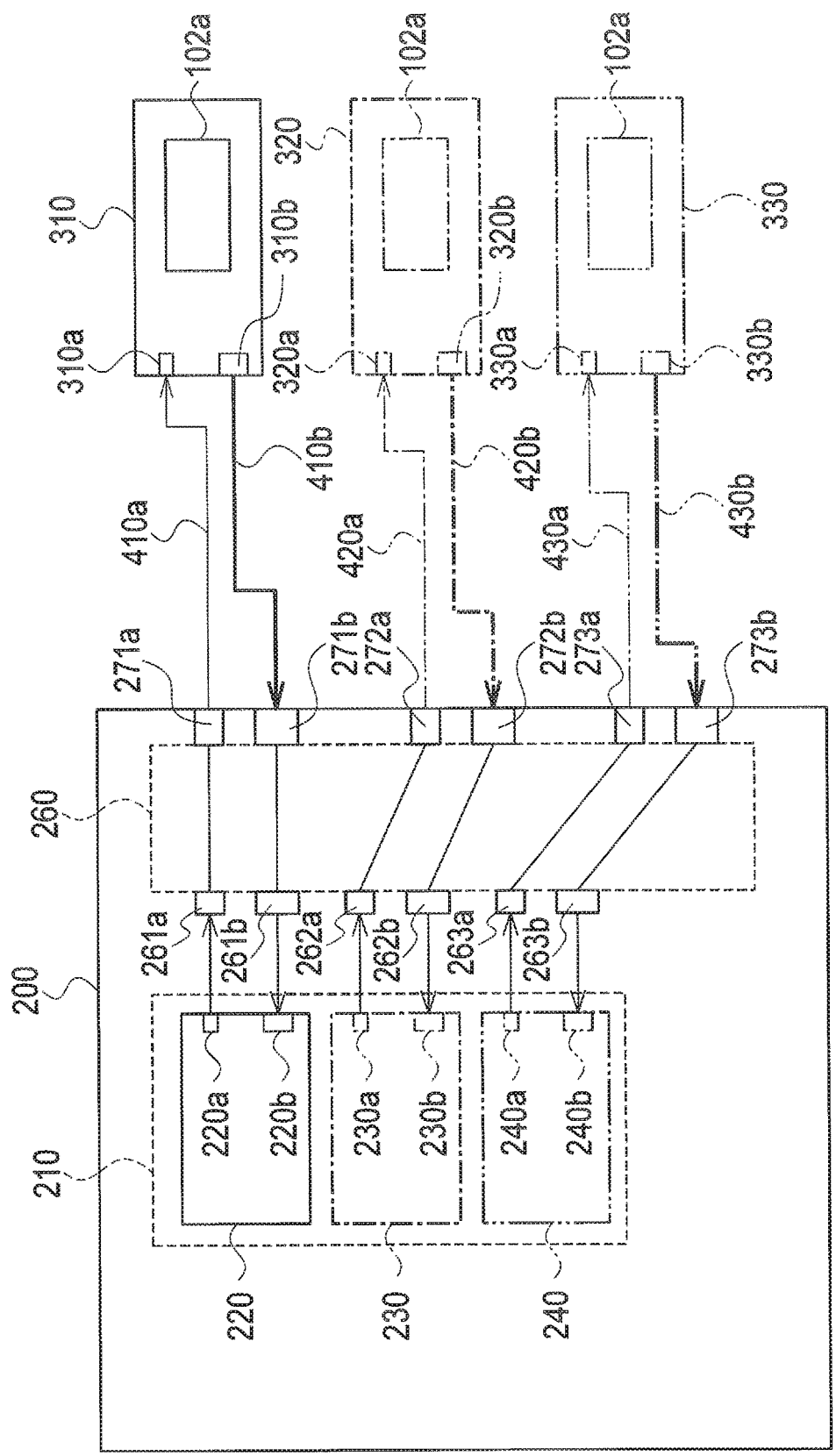
FIG. 5 is an explanatory diagram illustrating a correct connection relation between the mounting substrate of the control unit and the mounting substrate of the drive circuit for the printer unit in FIG. 3.

Here, as illustrated in an explanatory diagram in FIG. 5, if the connector 271*a* corresponding to the control unit 220 and the connector 310*a* of the sub substrate 310 are correctly connected together by the harness 410*a*, it will be possible to transmit the control signal that the control unit 220 outputs to the drive circuit 102*a* of the sub substrate 310 as a transmission destination.

In addition, if the connector 271*b* corresponding to the control unit 220 and the connector 310*b* of the sub substrate 310 are correctly connected together by the harness 410*b*, it will be possible to transmit the signal from the drive circuit 102*a* of the sub substrate 310 to the control unit 220.

Likewise, if the connector 272*a* corresponding to the control unit 230 and the connector 320*a* of the sub substrate 320 are correctly connected together by the harness 420a, it will be possible to transmit the control signal that the control unit 230 outputs to the drive circuit 102a of the sub substrate 320 as the transmission destination.

In addition, if the connector 272b corresponding to the control unit 230 and the connector 320b of the sub substrate 320 are correctly connected together by the harness 420b, it will be possible to transmit the signal from the drive circuit 102a of the sub substrate 320 to the control unit 230.

In addition, if the connector 273a corresponding to the control unit 240 and the connector 330a of the sub substrate 330 are correctly connected together by the harness 430a, it will be possible to transmit the control signal that the control unit 240 outputs to the drive circuit 102a of the sub substrate 330 as the transmission destination.

In addition, if the connector 273b corresponding to the control unit 240 and the connector 330b of the sub substrate 330 are correctly connected together by the harness 430b, it will be possible to transmit the signal from the drive circuit 102a of the sub substrate 330 to the control unit 240.

Incidentally, the connectors 271a to 273a on the output side of the main substrate 200 and the connectors 310a to 330a on the input sides of the respective sub substrates 310 to 330 are designed to use common components and the harnesses 410a to 430a used for connections between the connectors 271a to 273a and 310a to 330a respectively are also designed to use common components.

Likewise, the connectors 271b to 273b on the input side of the main substrate 200 and the connectors 310b to 330b on the output sides of the respective sub substrates 310 to 330 are designed to use common components and the harnesses 410b to 430b respectively used for connections between the connectors 271b to 273b and 310b to 330b respectively are also designed to use common components.

Accordingly, the main substrate 200 and the respective sub substrates 310 to 330 may be connected via the harnesses 410a to 430a and 410b to 430b physically in an erroneous pattern.

Figure 6:
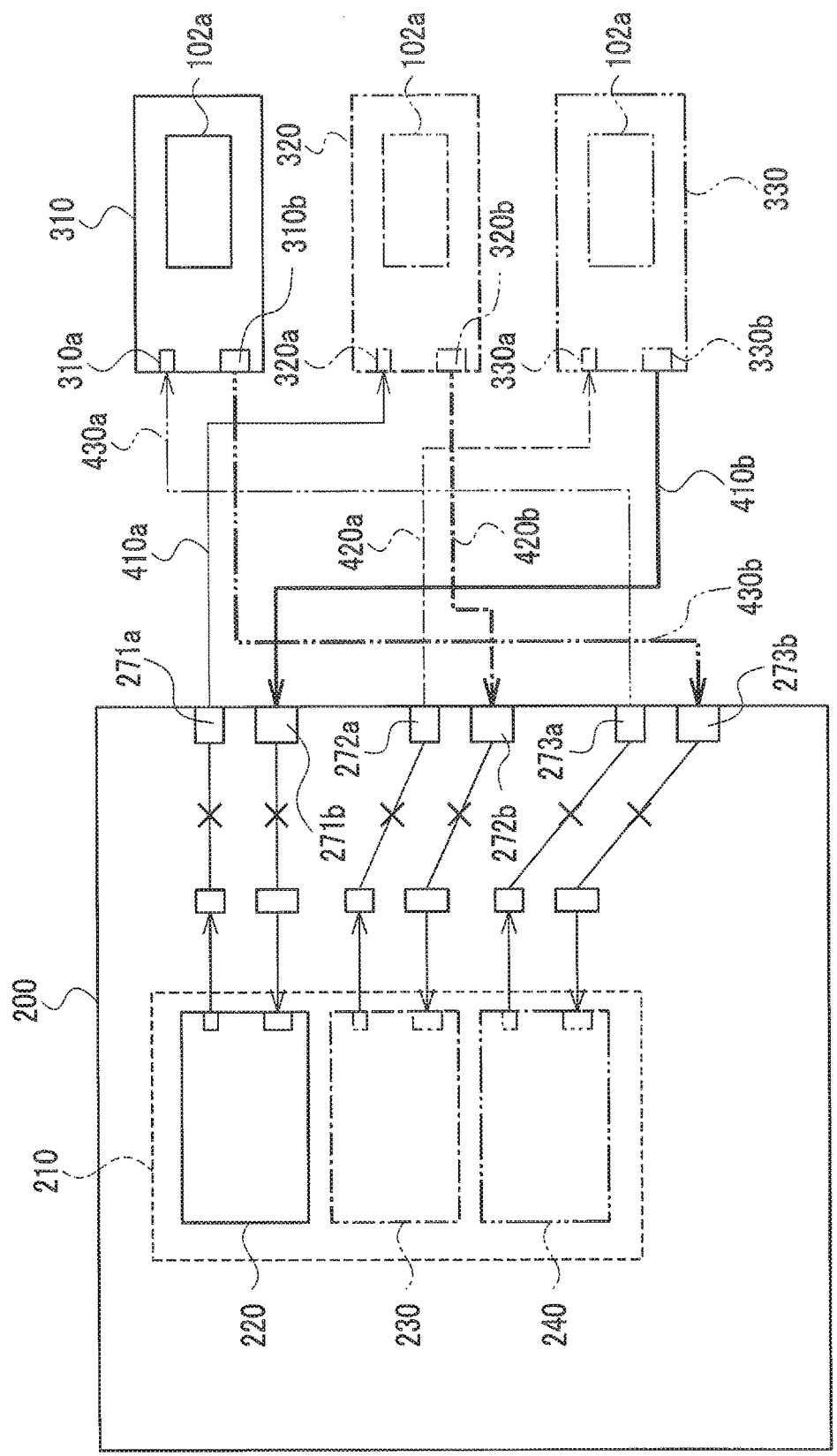
FIG. 6 is an explanatory diagram illustrating a faulty connection relation between the mounting substrate of the control unit and the mounting substrate of the drive circuit for the printer unit in FIG. 3.

As an example of connection in the erroneous pattern, as illustrated in FIG. 6, erroneous connection of the harness 410a which is connected to the connector 271a of the main substrate 200 to the connector 320a of the sub substrate 320, not to the connector 310a of the sub substrate 310 which is the original connection destination may physically occur.

Other examples of erroneous connection illustrated in FIG. 6 are as follows.

The harness 420a connected to the connector 272a of the main substrate 200 is erroneously connected to the connector 330a of the sub substrate 330, not to the connector 320a of the sub substrate 320 which is the original connection destination.

The harness 430a connected to the connector 273a of the main substrate 200 is erroneously connected to the connector 310a of the sub substrate 310, not to the connector 330a of the sub substrate 330 which is the original connection destination.

The harness 410b connected to the connector 271b of the main substrate 200 is erroneously connected to the connector 330b of the sub substrate 330, not to the connector 310b of the sub substrate 310 which is the original connection destination.

The harness 430b connected to the connector 273b of the main substrate 200 is erroneously connected to the connector 310b of the sub substrate 310, not to the connector 330b of the sub substrate 330 which is the original connection destination.

Erroneous connection of the harness to the connector which is not the original connection destination may physically occur in this way.

If the main substrate 200 and the respective sub substrates 310 to 330 are connected via the harnesses 410a to 430a and 410b to 430b in the erroneous pattern in this way, the control signal that the control units 220 to 240 output may not be correctly transmitted to the drive circuits 102a of the sub substrates 310 to 330 which are the correct transmission destinations, respectively.

Accordingly, in the present embodiment, as illustrated in FIG. 4, a relation of connection between the control units 220 to 240 and the connectors 271a to 273a and 271b to 273b of the main substrate 200 is optimized by the programmable logic circuit unit 260.

Figure 7:
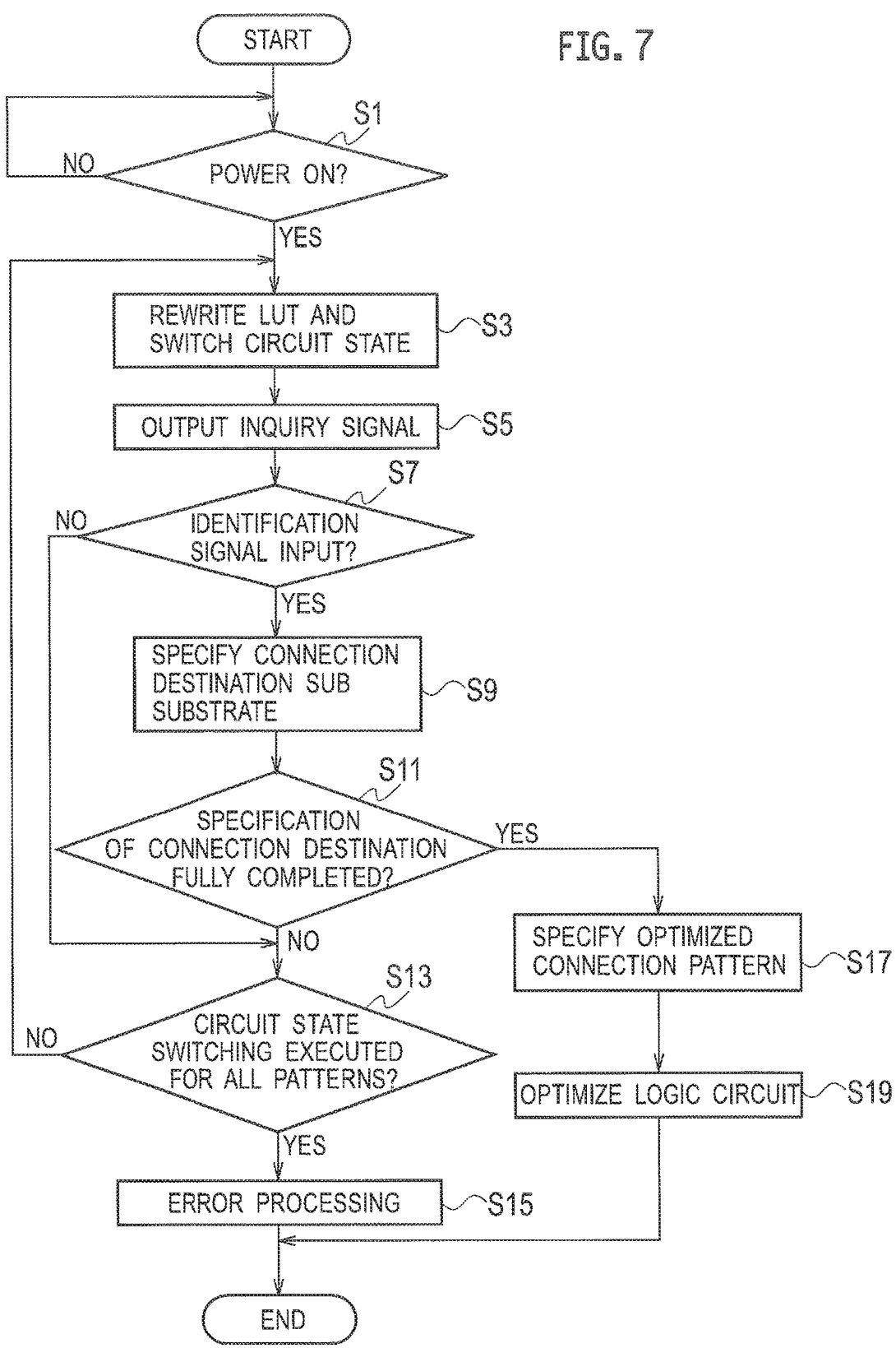
FIG. 7 is a flowchart illustrating a procedure of sequence control that a check unit in FIG. 4 performs.

Before the boot (start-up) processing of the microcomputer 210 in association with power on of a not illustrated power source of the inkjet printer 1, the check unit 250 performs sequence control of a procedure illustrated in a flowchart in FIG. 7 and thereby optimization by the programmable logic circuit unit 260 is performed.

First, when the not illustrated power source of the inkjet printer 1 is powered on (YES in step S1), the check unit 250 downloads one of the lookup tables stored in the memory 250a to the programmable logic circuit unit 260 to rewrite the lookup table in the memory 260b and switches the circuit state that the logic circuit 260a implements (step S3).

Specifically, the check unit 250 reads out from the memory 250a the lookup table indicating that the port 264a of the programmable logic circuit unit 260 and any one of the connectors 271a to 273a are connected together and the port 264b and any one of the connectors 271b to 273b are connected together simultaneously. The check unit 250 downloads the read-out lookup table to the programmable logic circuit unit 260 to rewrite the lookup table in the memory 260b.

Thereby, the port 264a of the programmable logic circuit unit 260 is connected with any one of the connectors 271a to 273a and the port 264b is connected with any one of the connectors 271b to 273b simultaneously. The circuit state as mentioned above is implemented by the logic circuit 260a of the programmable logic circuit unit 260.

Figure 8:
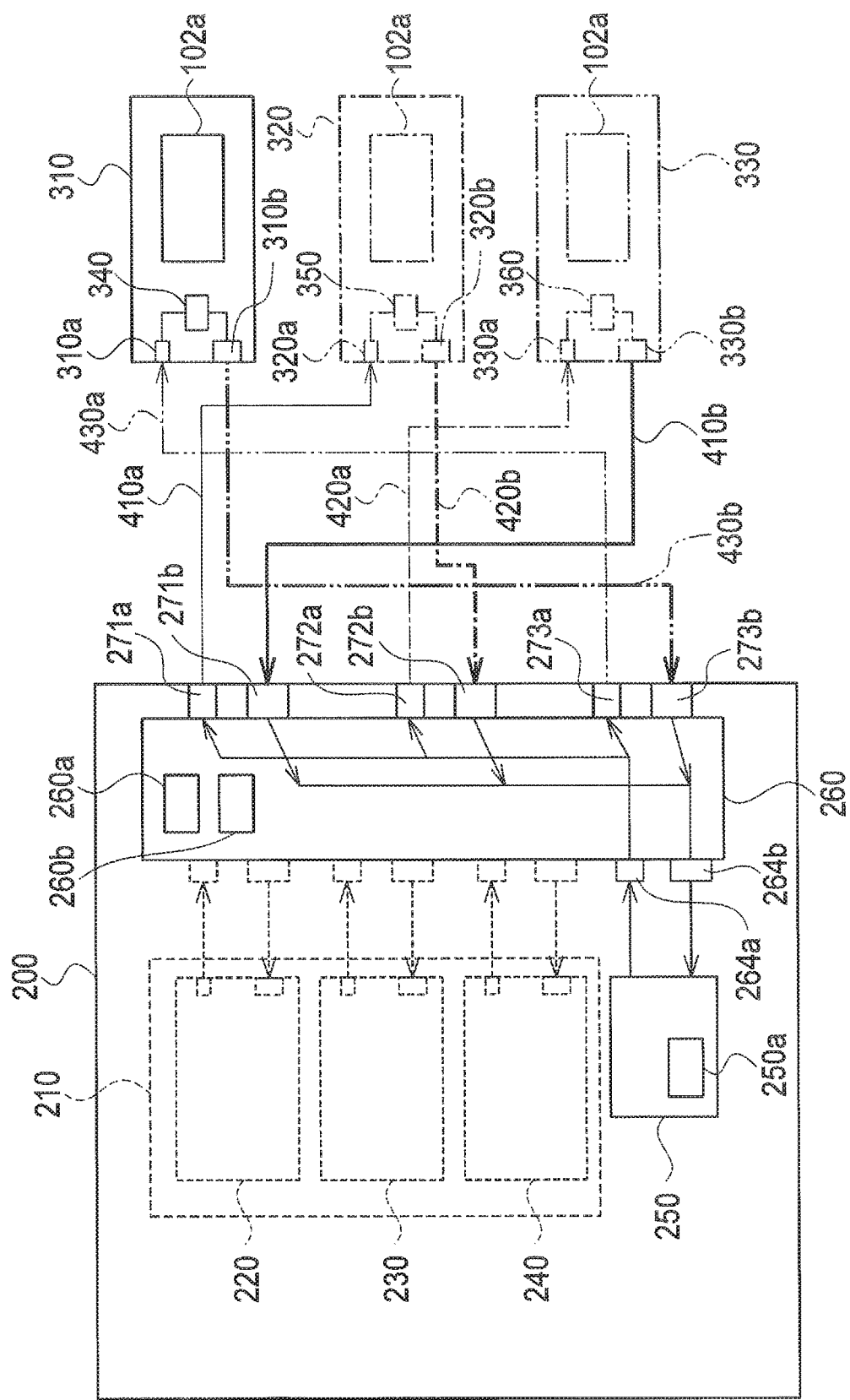
FIG. 8 is an explanatory diagram illustrating a switching operation of a connection pattern of a programmable logic circuit unit using a check unit and a detection circuit in FIG. 4.

Then, the check unit 250 outputs the inquiry signal for identification of the sub substrates 310 to 330 (step S5). As illustrated in FIG. 8, the inquiry signal is input from any one of the connectors 271a to 273a on the output side connected to the port 264a into any one of the sub substrates 310 to 330 as the connection destination via any one of the harnesses 410a to 430a.

In the sub substrates 310 to 330 into which the inquiry signal has been input, the check circuits 340 to 360 output the identification signals for the sub substrates 310 to 330 to the connectors 310b to 330b. The identification signals are input into the connectors 271b to 273b on the input side to which the harnesses 410b to 430b are connected via the harnesses 410b to 430b connected to the connectors 310b to 330b.

When the connectors 271b to 273b into which the identification signals have been input are connected to the port 264b by the logic circuit 260a of the programmable logic circuit unit 260, the identification signals are input into the check unit 250 via the port 264b as illustrated in FIG. 8.

Then, the check unit 250 confirms whether the identification signals have been input within a predetermined period of time counted from outputting of the inquiry signal (step S7) and shifts to later described step S13 when the identification signals are not input within the predetermined period of time (NO in step S7). While, when the identification signals have been input within the predetermined period of time (YES in step S7), the check unit 250 specifies the sub substrates 310 to 330 which are the connection destinations of the connectors 271a to 273a and 271b to 273b on the output side and the input side respectively connected to the ports 264a and 264b by the logic circuit 260a on the basis of the input identification signals (step S9).

Examples of processes in steps S3, S5, S7 and S9 will be given in the following.

In the example illustrated in FIG. 8, a case where the port 264a of the programmable logic circuit unit 260 is connected to the "connector 271a" and the port 264b is connected to the "connector 272b" is considered. Here, since the check unit 250 holds information on the lookup table which has been downloaded to the programmable logic circuit unit 260, attention is paid to the point that the check unit 250 holds such information that the connection destination of the port 264a is the "connector 271a" and the connection destination of the port 264b is the "connector 272b".

In this case, since the port 264a is connected to the connector 271a, the inquiry signal output from the check unit 250 is input into the port 264a and is output from the connector 271a.

Since the connector 271a is connected to the connector 320a of the sub substrate 320 via the harness 410a, the inquiry signal output from the check unit 250 is input into the check circuit 350 of the sub substrate 320. Then, the check circuit 350 of the sub substrate 320 outputs the identification signal for the sub substrate 320 to the connector 320b.

Since the connector 320b is connected to the connector 272b of the main substrate 200 via the harness 420b and the port 264b is connected to the connector 272b, the identification signal for the sub substrate 320 which has been output from the check circuit 350 of the sub substrate 320 is input into the check unit 250.

Here, the check unit 250 holds such information that the connectors as the connection destinations of the ports 264a and 264b of the programmable logic circuit unit 260 are respectively the connectors 271a and 272b. Therefore, the check unit 250 acquires such information that the inquiry signal has been output from the connector 271a to any one of the sub substrates 310 to 330 and the identification signal has been input into the check unit 250 via the connector 272b on the basis of such information that after the inquiry signal has been output, the identification signal has been input into itself.

Then, the check unit 250 specifies that the connector 271a of the programmable logic circuit unit 260 is connected to the connector 320a of the "sub substrate 320" because the identification signal which has been input into the check unit 250 is the identification signal for the "sub substrate 320". Further, the check unit 250 specifies that the connector 272b of the programmable logic circuit unit 260 is connected to the connector 320b of the "sub substrate 320".

That is, the check unit 250 specifies that the connection destination of the connector 271a is the sub substrate 320 and the connection destination of the connector 272b is the sub substrate 320 on the basis of the identification signal which has been input into the check unit 250.

In the above-mentioned description, a case where the identification signal is input into the check unit 250 after the check unit 250 has output the inquiry signal has been given by way of example. On the other hand, in a case where the identification signal is not input into the check unit 250, it is difficult for the check unit 250 to specify the connection destination as mentioned above.

After the process in step S9, in step S11, the check unit 250 confirms whether or not specification of the sub substrates 310 to 330 as the connection destinations has been terminated for all of the connectors 271a to 273a and 271b to 273b (step S11). In a case where the specification has been totally terminated (YES, in step S11), the check unit 250 shifts to later described step S17. While in a case where the specification is not yet partially terminated (NO in step S11), the check unit 250 shifts to step S13.

In step S13, the check unit 250 downloads all of the lookup tables in the memory 250a to the programmable logic circuit unit 260 and confirms whether or not switching of all patterns of the circuit states implementation that the logic circuit 260a can implement has been completely executed. In a case where switching of all patterns is not yet completely executed (NO in step S13), the check unit 250 returns to step S3. The check unit 250 performs in order specification of the sub substrates 310 to 330 as the connection destinations for all of the connectors 271a to 273a and 271b to 273b in this way.

On the other hand, in a case where switching of all patterns has been completely executed (YES in step S13), the check unit 250 performs error processing, judging that an error such as a wire disconnection, a connector disconnection or the like has occurred in the harnesses 410a to 430a and 410b to 430b (step S15).

In the error processing in step S15, the check unit 250 downloads a lookup table for full open pattern which is stored in the memory 250a to the programmable logic circuit unit 260 to rewrite the lookup table in the memory 260b. Then, the check unit 250 switches the circuit state that the logic circuit 260a implements to an open state where none of the control units 220 to 240 and none of the connectors 271a to 273a and 271b to 273b are mutually connected, which correspond to the lookup table for full open pattern.

Thereby, it is possible to prevent the control signals from the control units 220 to 240 from being transmitted to the drive circuit 102a of one of the wrong sub substrates 310 to 330 by the logic circuit 260a of the programmable logic circuit unit 260. Thereby, it is possible to prevent signal transmission to the wrong destination between the main substrate 200 and each of the sub substrates 310 to 330, it is possible to prevent the microcomputer 210 of the main substrate 200 and the drive circuit 102a of each sub substrate (310 to 330) from entering indefinite value input states and it is possible to prevent a malfunction of the inkjet head 31 caused by the indefinite value input states of the microcomputer 210 and the drive circuits 102a.

Then, in step S17 to which the check unit 250 proceeds in a case where specification of the sub substrates 310 to 330 as the connection destinations has been terminated for all of the connectors 271a to 273a and 271b to 273b (YES in step S11), the check unit 250 specifies an optimized connection pattern of the logic circuit 260a in which the control signals from the control units 220 to 240 are transmitted to the respective sub substrates 310 to 330 on which the corresponding drive circuits 102a are mounted.

Then, the check unit 250 downloads the lookup table corresponding to the specified connection pattern from the memory 250a to the programmable logic circuit unit 260 to rewire the lookup table in the memory 260b so as to optimize the circuit state that the logic circuit 260a implements (step S19) and terminates a series of procedures.

Figure 9:
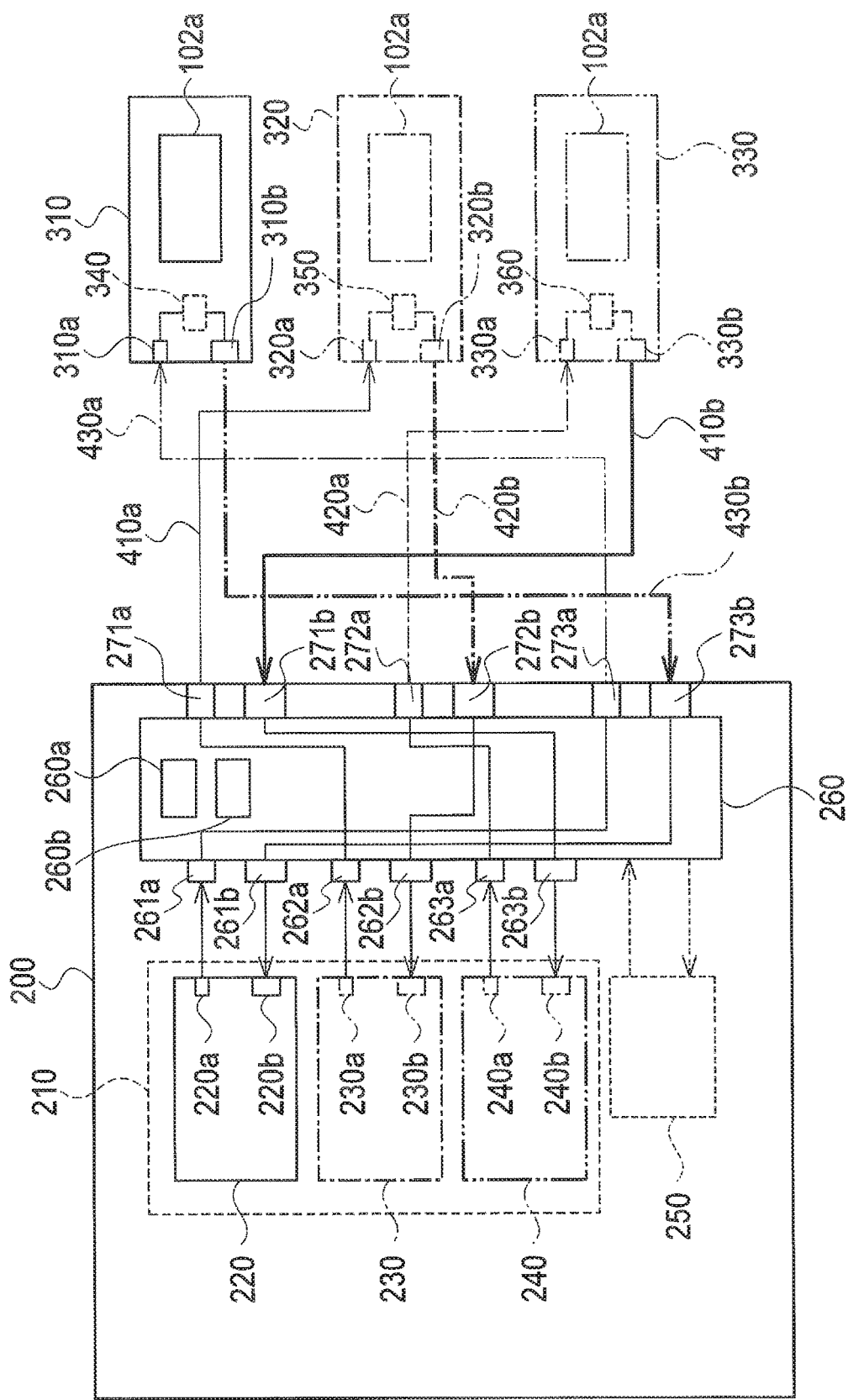
FIG. 9 is an explanatory diagram illustrating a state where the programmable logic circuit unit in FIG. 4 has been fixed to a connection pattern for correctly connecting the mounting substrate of the control unit with the mounting substrate of the drive circuit for the printer unit.

When the sequence control of the above procedures by the check unit 250 is terminated, as illustrated in an explanatory diagram in FIG. 9, the logic circuit 260a of the programmable logic circuit unit 260 enters the circuit state where the control signals from the control units 220 to 240 are transmitted to the respective sub substrates 310 to 330 on which the corresponding drive circuits 102a are mounted.

Then, as indicated by a broken line in FIG. 9, after the check unit 250 and the check circuits 340 to 360 of the respective sub substrates 310 to 330 have shifted to sleep states, the microcomputer 210 is boosted (started-up) and the operation of the inkjet printer 1 is started.

Summarizing the above, according to the inkjet printer 1 of the present embodiment, before the boot processing of the control units 220 to 240 of the main substrate 200, the check unit 250 specifies the sub substrates 310 to 330 as the connection destinations which are connected to the connectors 271a to 273a and 271b to 273b respectively via the harnesses 410a to 430a and 410b to 430b. Thereby, the physical connection relation between the respective connectors 271a to 273a and 271b to 273b and the sub substrates 310 to 330 is specified. The check unit 250 switches the connection pattern of the programmable logic circuit unit 260 in correspondence with the specified physical connection relation.

Thereby, after the boot processing of the control units 220 to 240, the control signals which have been output from the ports 220a to 240a and 220b to 240b of the control units 220 to 240 are output to the connectors 271a to 273a and 271b to 273b to which the sub substrates 310 to 330 which are the transmission destinations corresponding to the control signals are connected by the programmable logic circuit unit 260.

The connection relation between the control units 220 to 240 and the sub substrates 310 to 330 is optimized by the programmable logic circuit unit such that the signals which have been output from the control units 220 to 240 to the respective drive circuits 102a are transmitted from the main substrate 200 to the sub substrates 310 to 330 which are the correct transmission destinations in this way.

That is, before boot of the microcomputer 210, the connection relation between the main substrate 200 on which the control unit 10 is mounted and the sub substrates 310 to 330 on which the drive circuits 102a of the inkjet heads 31 are mounted is optimized by the logic circuit 260a of the programmable logic circuit unit 260.

Therefore, it becomes possible to correctly transmit the control signals that the control units 220 to 240 output to the sub substrates 310 to 330 which are the transmission destinations and on which the drive circuits 102a which are the transmission destinations of the control signals are mounted.

Accordingly, even when the main substrate 200 and the plurality of sub substrates 310 to 330 are connected together by using the same cable and connectors, after optimization by the logic circuit 260a of the programmable logic circuit unit 260, such a problem that the control signal is transmitted to the wrong transmission destination does not occur and it is possible to transmit and receive the correct signals between the main substrate 200 and the respective sub substrates 310 to 330.

In addition, every time the connection pattern of the programmable logic circuit unit 260 is switched, the inquiry signal is output from the check unit 250 to the harnesses 410a to 430a via the connectors 271a to 273a. Consequently, the inquiry signal from the check unit 250 is input into the respective sub substrates 310 to 330. When the inquiry signal from the check unit 250 is input into the respective sub substrates 310 to 330, the identification signals of the sub substrates 310 to 330 are output to the harnesses 410b to 430b by the check circuits 340 to 360 of the respective sub substrates 310 to 330. The identification signals are input into the main substrate via the connectors 271b to 273b to which the harnesses are connected.

Therefore, it is possible for the check unit 250 to surely specify the sub substrates which are the connection destinations connected to the respective connectors 271b to 273b via the harnesses 410b to 430b on the basis of a relation between the identification signals that the check circuits 340 to 360 of the respective sub substrates 310 to 330 has been output and the connectors 271b to 273b into which the identification signals have been input.

In a case where it is difficult to specify the sub substrates 310 to 330 which are the connection destinations connected to the respective connectors 271a to 273a and 271b to 273b before the boot processing of the control units 220 to 240, it is difficult to transmit the control signals from the respective ports 220a to 240a to the sub substrates 310 to 330 which are the correct transmission destinations no matter how the respective ports 220a to 240a and 220b to 240b of the control units 220 to 240 and the respective connectors 271a to 273a and 271b to 273b are connected together by the programmable logic circuit unit 260.

It is possible to prevent the control signals from the respective ports 220a to 240a of the control units 220 to 240 from being erroneously transmitted to the sub substrates 310 to 330 which are the wrong transmission destinations by setting the connection between the respective ports 261a to 263a and 261b to 263b and the respective connectors 271a to 273a and 271b to 273b to the open state by the programmable logic circuit unit 260.

Incidentally, in the present embodiment, the inkjet printer 1 is configured such that when the check unit 250 specifies the sub substrates 310 to 330 which are connected to the connectors 271a to 273a and 271b to 273b respectively via the harnesses 410a to 430a and 410b to 430b, the inquiry signal is output and the check circuits 340 to 360 of the sub substrates 310 to 330 into which the inquiry signal has been input output the identification signals for the sub substrates 310 to 330 which are the mounting destinations.

However, a way that the check unit 250 specifies the sub substrates 310 to 330 which are the connection destinations connected to the connectors 271a to 273a and 271b to 273b is not limited to transmission and reception of the inquiry signal and the identification signals and is optionally selected.

In addition, the device to be used as the programmable logic circuit unit 260 may be any device not limited to the FPGA as long as it is a programmable logic device (PLD) which allows switching of the circuit state by the reconfiguration function (a resetting function).

Further, in the present embodiment, description has been made in a case that the inkjet heads 31 for four colors are arranged corresponding to inks of four colors (C, K, M and Y), by taking as an example the inkjet printer 1 compatible with full-color printing.

However, the present invention is also applicable to, for example, such a case where the drive circuits 102a corresponding to the respective head blocks 31a of the inkjet head 31 in the device compatible with single-color printing are mounted on the respective sub substrates and the main substrate 200 on which the control unit 10 for outputting the control signal to the drive circuit 102a is mounted and the sub substrate are to be connected together.

In addition, in the present embodiment, a case where the present invention has been applied to the connection between the main substrate 200 on which the control unit 10 of the inkjet printer 1 is mounted and the sub substrates 310 to 330 on which the drive circuits 102a of the inkjet heads 31 are mounted has been described.

However, the present invention is widely applicable to such a situation that the plurality of sub substrates is to be connected with the main substrate which includes the plurality of connectors to which the plurality of harnesses which is respectively connected to the controlled circuits on the respective sub substrates is respectively connected and on which the main controller which outputs the control signals for the controlled circuits respectively from the ports corresponding to the individual sub substrates as the transmission destinations is mounted, not limited to the inkjet printer 1.

The present invention is not limited to the above-mentioned embodiments as it is and constitutional elements may be altered and embodied within a range not deviating from the gist thereof in the implementation phase. In addition, it is possible to form various inventions by appropriately combining together the plurality of constitutional elements disclosed in the above-mentioned embodiments. For example, some constitutional elements may be deleted from all of the constitutional elements described in the embodiments.

In addition, for example, each of the functions described above and/or each of the processes described above may be implemented by one or more processing circuit(s). The processing circuits include a programmed processor, an electric circuit and so forth and also include a device such as an integration circuit (ASIC) for specific application, circuit constitutional elements arranged so as to execute the described functions and so forth.

The present patent application claims the priority based on Japanese Patent Application No. 2015-037829 filed on Feb. 27, 2015 and the entire content of the present patent application is incorporated herein by reference.

According to the present invention, even when the main substrate and each of the plurality of sub substrates are connected together by using the same cable and connectors, after optimization has been performed by the programmable logic circuit unit, the disadvantage caused by faulty connection (the disadvantage that the control signal is transmitted to the wrong transmission destination) does not occur and it is possible to transmit and receive the correct signals between the main substrate and each of the sub substrates.

What is claimed is:

1. A substrate connection system, comprising:
   a plurality of sub substrates;
   a main substrate including a plurality of connectors to which a plurality of harnesses each connected to a controlled circuit mounted on each of the sub substrates is to be connected, respectively;
   a main controller which is mounted on the main substrate and outputs a control signal for the controlled circuit on each of the sub substrates from each port corresponding to a sub substrate which is a transmission destination;
   a programmable logic circuit unit which is mounted on the main substrate and capable of switching a pattern of connection between each port of the main controller and each of the plurality of connectors; and
   a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before supplying power to the main controller.

2. A substrate connection system comprising:
   a plurality of sub substrates;
   a main substrate including a plurality of connectors to which a plurality of harnesses each connected to a controlled circuit mounted on each of the sub substrates is to be connected, respectively;
   a main controller which is mounted on the main substrate and outputs a control signal for the controlled circuit on each of the sub substrates from each port corresponding to a sub substrate which is a transmission destination;
   a programmable logic circuit unit which is mounted on the main substrate and capable of switching a pattern of connection between each port of the main controller and each of the plurality of connectors;
   a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller; and
   a check circuit which is mounted in each of the sub substrates and outputs an identification signal for specifying the sub substrate which is the connection destination to the harness in response to an input of an inquiry signal that the sub controller outputs to the sub substrates which are the connection destinations respectively connected to the respective connectors via the harnesses every time the connection pattern of the programmable logic circuit unit is switched, wherein
   the sub controller specifies the sub substrates which are the connection destinations respectively connected to the respective connectors by the sub substrates which are the connection destinations specified by the identification signals from the respective sub substrate and the connectors into which the identification signals are input via the harnesses.

3. A substrate connection system, comprising:
   a plurality of sub substrates;
   a main substrate including a plurality of connectors to which a plurality of harnesses each connected to a controlled circuit mounted on each of the sub substrates is to be connected, respectively;
   a main controller which is mounted on the main substrate and outputs a control signal for the controlled circuit on each of the sub substrates from each port corresponding to a sub substrate which is a transmission destination;
   a programmable logic circuit unit which is mounted on the main substrate and capable of switching a pattern of connection between each port of the main controller and each of the plurality of connectors; and
   a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller, wherein the programmable logic circuit unit is configured by a field-programmable gate array (FPGA) which includes a logic circuit and a memory that stores a lookup table for defining a circuit state realized by the logic circuit, and the sub controller switches the connection pattern of the programmable logic circuit unit by rewriting the content of the lookup table in the memory to a content corresponding to each of the connection patterns.

4. A substrate connection system, comprising:

a plurality of sub substrates;

a main substrate including a plurality of connectors to which a plurality of harnesses each connected to a controlled circuit mounted on each of the sub substrates is to be connected, respectively;

a main controller which is mounted on the main substrate and outputs a control signal for the controlled circuit on each of the sub substrates from each port corresponding to a sub substrate which is a transmission destination;

a programmable logic circuit unit which is mounted on the main substrate and capable of switching a pattern of connection between each port of the main controller and each of the plurality of connectors; and a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller, wherein the sub controller switches connection by the programmable logic circuit unit between the respective ports and the plurality of connectors to an open state when the sub controller fails to specify the sub substrates which are the connection destinations respectively connected to the respective connectors before the boot processing of the main controller.

5. An inkjet recording device which forms an image on a print medium with ink ejected from nozzles of a plurality of inkjet heads, the inkjet recording device comprising:

a plurality of sub substrates on which drive circuits of the respective inkjet heads are mounted; and a main substrate having mounted thereon a plurality of connectors to which a plurality of harnesses connected to the respective drive circuits of the respective sub substrates is connected respectively, a main controller which outputs a control signal according to an ink ejection pattern of the respective inkjet heads that the respective drive circuits respectively drive from each port corresponding to a sub substrate which is a transmission destination, and a substrate connection system which switches a pattern of connection between respective ports of the main controller and the plurality of connectors, wherein the substrate connection system includes:

a programmable logic circuit unit which is mounted on the main substrate and capable of switching a pattern of connection between each port of the main controller and each of the plurality of connectors; and a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before supplying power to the main controller.

6. An inkjet recording device which forms an image on a print medium with ink ejected from nozzles of a plurality of inkjet heads, the inkjet recording device comprising:

a plurality of sub substrates on which drive circuits of the respective inkjet heads are mounted; and a main substrate having mounted thereon a plurality of connectors to which a plurality of harnesses connected to the respective drive circuits of the respective sub substrates is connected respectively, a main controller which outputs a control signal according to an ink ejection pattern of the respective inkjet heads that the respective drive circuits respectively drive from each port corresponding to a sub substrate which is a transmission destination, and a substrate connection system which switches a pattern of connection between respective ports of the main controller and the plurality of connectors, wherein the substrate connection system includes:

a programmable logic circuit unit which is mounted on the main substrate and capable of switching a pattern of connection between each port of the main controller and each of the plurality of connectors; and a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller; and a check circuit which is mounted in each of the sub substrates and outputs an identification signal for specifying the sub substrate which is the connection destination to the harness in response to an input of an inquiry signal that the sub controller outputs to the sub substrates which are the connection destinations respectively connected to the respective connectors via the harnesses every time the connection pattern of the programmable logic circuit unit is switched, wherein the sub controller specifies the sub substrates which are the connection destinations respectively connected to the respective connectors by the sub substrates which are the connection destinations specified by the identification signals from the respective sub substrate and the connectors into which the identification signals are input via the harnesses.

7. An inkjet recording device which forms an image on a print medium with ink ejected from nozzles of a plurality of inkjet heads, the inkjet recording device comprising:
a plurality of sub substrates on which drive circuits of the respective inkjet heads are mounted; and
a main substrate having mounted thereon
a plurality of connectors to which a plurality of harnesses connected to the respective drive circuits of the respective sub substrates is connected respectively,
a main controller which outputs a control signal according to an ink ejection pattern of the respective inkjet heads that the respective drive circuits respectively drive from each port corresponding to a sub substrate which is a transmission destination, and
a substrate connection system which switches a pattern of connection between respective ports of the main controller and the plurality of connectors, wherein the substrate connection system includes:
a programmable logic circuit unit which is mounted on the main substrate and capable of switching a pattern of connection between each port of the main controller and each of the plurality of connectors; and
a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller, wherein:
the programmable logic circuit unit is configured by a field-programmable gate array (FPGA) which includes a logic circuit and a memory that stores a lookup table for defining a circuit state realized by the logic circuit, and
the sub controller switches the connection pattern of the programmable logic circuit unit by rewriting the content of the lookup table in the memory to a content corresponding to each of the connection patterns.

8. An inkjet recording device which forms an image on a print medium with ink ejected from nozzles of a plurality of inkjet heads, the inkjet recording device comprising:
a plurality of sub substrates on which drive circuits of the respective inkjet heads are mounted; and
a main substrate having mounted thereon
a plurality of connectors to which a plurality of harnesses connected to the respective drive circuits of the respective sub substrates is connected respectively,
a main controller which outputs a control signal according to an ink ejection pattern of the respective inkjet heads that the respective drive circuits respectively drive from each port corresponding to a sub substrate which is a transmission destination, and
a substrate connection system which switches a pattern of connection between respective ports of the main controller and the plurality of connectors, wherein the substrate connection system includes:
a programmable logic circuit unit which is mounted on the main substrate and capable of switching a pattern of connection between each port of the main controller and each of the plurality of connectors; and
a sub controller which is mounted on the main substrate and specifies the sub substrates which are connection destinations respectively connected to the respective connectors via the harnesses and switches the connection pattern of the programmable logic circuit unit to a pattern of connection between the specified sub substrates which are the connection destinations of the respective connectors and the ports of the main controller which output the control signal to be transmitted to the sub substrates which are the connection destinations, before boot processing of the main controller, wherein
the sub controller switches connection by the programmable logic circuit unit between the respective ports and the plurality of connectors to an open state when the sub controller fails to specify the sub substrates which are the connection destinations respectively connected to the respective connectors before the boot processing of the main controller.

* * * * *